(12) United States Patent
Kawabata et al.

(10) Patent No.: US 9,366,735 B2
(45) Date of Patent: Jun. 14, 2016

(54) OPTICAL PUMPING MAGNETOMETER

(71) Applicant: Hitachi, Ltd., Chiyoda-ku, Tokyo (JP)

(72) Inventors: Ryuzo Kawabata, Higashiyamoto (JP); Akihiko Kandori, Tokyo (JP); Taro Osabe, Tachikawa (JP); Seiichi Suzuki, Tokyo (JP); Yudai Kamada, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 661 days.

(21) Appl. No.: 13/827,062

(22) Filed: Mar. 14, 2013

(65) Prior Publication Data

US 2013/0265042 A1    Oct. 10, 2013

(30) Foreign Application Priority Data

Apr. 6, 2012 (JP) .................................. 2012-086954

(51) Int. Cl.
*G01R 33/26* (2006.01)
(52) U.S. Cl.
CPC ....................................... *G01R 33/26* (2013.01)
(58) Field of Classification Search
CPC ........................................................ G01R 33/26
See application file for complete search history.

(56) References Cited

U.S. PATENT DOCUMENTS

| | | | | |
|---|---|---|---|---|
| 5,036,278 A * | 7/1991 | Slocum | ................. | H01S 5/0687 324/304 |
| 7,652,473 B2 * | 1/2010 | Kawabata | .............. | G01R 33/26 324/301 |
| 7,656,154 B2 * | 2/2010 | Kawabata | .......... | G01R 33/0354 324/244.1 |
| 2007/0120563 A1 | 5/2007 | Kawabata et al. | | |
| 2011/0095755 A1 | 4/2011 | Maki | | |
| 2011/0297372 A1* | 12/2011 | Maida, Jr. | ............. | E21B 47/024 166/255.2 |
| 2014/0306700 A1* | 10/2014 | Kamada | ................ | G01R 33/26 324/244.1 |

FOREIGN PATENT DOCUMENTS

| | | |
|---|---|---|
| JP | 62-198768 A | 9/1987 |
| JP | 2006-339055 A | 12/2006 |
| JP | 2007-167616 A | 7/2007 |
| JP | 2010-85134 A | 4/2010 |
| JP | 2011-89868 A | 5/2011 |
| WO | WO 2011/057146 A1 | 5/2011 |

OTHER PUBLICATIONS

Japanese Office Action issued in counterpart Japanese Application No. 2014-509115 dated Nov. 4, 2015 (Three (3) pages).

(Continued)

*Primary Examiner* — Dixomara Vargas
(74) *Attorney, Agent, or Firm* — Crowell & Moring LLP (57) ABSTRACT

Stable magnetic field measurement is enabled without collapse of polarization or fluctuation of intensity of a laser beam incident on a glass cell of an optical pumping magnetic sensor. Excitation light generated with a light source, having optimized light intensity and polarized wave, through frequency stabilization, intensity control and polarized-wave control, is introduced via a polarized wave holding optical fiber to a magnetic sensor provided in a magnetic shield, and magnetic field measurement is performed by optical pumping using magneto-optical properties of spin-polarized alkali metal. The magnetic sensor has a structure where a lens, a polarization optical device, the glass cell and a photodetector, are integrally accommodated in a non-magnetic case.

4 Claims, 8 Drawing Sheets

(56) References Cited

OTHER PUBLICATIONS

Scholtes, et al. "Light-narrowed optically pumped Mx magnetometer with a miniaturized Cs cell" Physical Review A, USA, American Physical Society, Oct. 12, 2011, vol. 84, p. 043416-1-043416-6, (Six (6) pages).

J. M. Higbie et al., "Robust, High-Speed, All-Optical Atomic Magnetometer", AIP Review of Scientific Instruments, vol. 77, 2006, American Institute of Physics, (Eight (8) pages).

R. W. P. Drever, "Laser Phase and Frequency Stabilization Using an Optical Resonator", Applied Physics B, vol. 31, 1983, pp. 97-105 (Nine (9) pages).

Kristan L. Corwin et al., "Frequency-Stabilized Diode Laser with the Zeeman Shift in an Atomic Vapor", vol. 37, No. 15, Applied Optics, 1998, pp. 3295-3298 (Four (4) pages).

* cited by examiner

FIG. 8

OPTICAL PUMPING MAGNETOMETER

CLAIM OF PRIORITY

The present application claims priority from Japanese patent application JP 2012-086954 filed on Apr. 6, 2012, the content of which is hereby incorporated by reference into this application.

BACKGROUND OF THE INVENTION

1. Field of the Invention

The present invention relates to a magnetometric technique utilizing magneto-optical effects by optical pumping.

2. Description of the Related Art

An optical pumping magnetometer utilizing magneto-optical effects by optical pumping uses a glass cell filled with alkali metal gas (e.g., potassium, rubidium or cesium) as a sensor. A static magnetic field is applied to the glass cell, to Zeeman-split energy level of the alkali metal in the glass cell. Then the glass cell is irradiated with the polarized-status-operated light such as linear polarized light, circularly polarized light or elliptically polarized light, or intensity/phase-operated light such as intensity modulated light or phase modulated light. Then magnetism entered the glass cell is detected by utilizing interaction between the light and the magnetism.

A magnetometer described in Japanese Patent Application Laid-Open Publication No. 2007-167616 discharges a laser beam in space thus irradiates the glass cell. Further, the magnetometer has a structure where the glass cell is accommodated in a magnetic shield (a magnetic shield room or magnetic shield case formed of a material having high magnetic permeability) such as permalloy.

Further, Japanese Patent Application Laid-Open Publication No. 2011-89868 discloses a magnetometer using a fiber cell filled with alkali metal atoms as a part of optical fiber. In this magnetometer, a laser as a light source and optical fiber including a glass cell are closely integrated so as to avoid influence of an unwanted external magnetic field and to accurately measure a magnetic field at a measurement point or in a measurement region.

In an optical pumping magnetometer described in Rev. Sci. Instrum. 77, 113106 (2006), to increase the gas density of alkali metal atoms in the glass cell, heated air is blown into a magnetic shield case having the glass cell, to maintain the temperature of the glass cell.

In the magnetometer described in Japanese Patent Application Laid-Open Publication No. 2007-167616, the optical path of the laser beam is not within a short range. Accordingly, in some cases it is difficult to adjust the laser beam optical path, or even when the optical path is controlled, the optical path is easily shifted since the length of the optical path is long, and re-control is required.

In the magnetometer described in Japanese Patent Application Laid-Open Publication No. 2011-89868, the laser as a light source and the optical fiber including the glass cell are integrated. The structure effectively addresses the above-described problems of the optical path control, the shift of the optical path, the influence of the optical path due to air flow and the like. However, when the glass cell is maintained at a temperature higher than a room temperature and the density of alkali metal gas in the glass cell is increased, the structure where the glass cell is included in the optical fiber has temperature unevenness in the optical fiber by maintaining the temperature of the glass cell. In the optical fiber, the polarization of a laser beam passing inside the optical fiber may be collapsed or the laser beam intensity is fluctuated due to such temperature change. When the status of the laser beam is changed, it is impossible to efficiently excite the alkali metal gas in the glass cell. Further, in Japanese Patent Application Laid-Open Publication No. 2011-89868, a use as a wrap status of the optical fiber including the glass cell is described. Even upon use of the optical fiber in folded status, the above-described a laser beam status is changed.

Further, in the magnetometer described in Rev. Sci. Instrum. 77, 113106 (2006), the glass cell is heated with heated air so as to increase the density of alkali metal gas. The magnetic noise caused by the heating using the heated air circulation employed in this example is less in comparison with that in the heating using an electric heater. However, noise occurs when the laser beam is swayed due to the influence of air flow by the heated air and the magnetic measurement signal is fluctuated. Actually, upon use of an optical pumping magnetic sensor in a room with an air conditioning system, when the optical path has unevenness by air flow due to the air conditioning, the sensing may be influenced.

SUMMARY OF THE INVENTION

The present provides an optical pumping magnetometer in which the optical axis of a laser beam introduced into a glass cell of a magnetic sensor is stable and is easily controllable, and the factor of the collapse of polarization of the laser beam is eliminated and mixture of magnetic noise is eliminated, so as to realize a stable operation.

A magnetometer according to a typical embodiment of the present invention has an optical pumping magnetic sensor utilizing magneto-optical properties of spin-polarized alkali metal as a primary functional component. Further, the magnetometer has a light source to irradiate the magnetic sensor with excitation light, a coil to apply a static magnetic field and an RF magnetic field to the magnetic sensor, and a signal control processor. The coil and the magnetic sensor are covered with a magnetic shield. The excitation light generated with the light source is frequency-stabilized, light-intensity modulated and polarization modulated in the space. The excitation light with the optimized light intensity and polarization and the stabilized frequency is introduced via polarized wave holding optical fiber into the magnetic sensor. The magnetic sensor has a structure where a lens, a polarization optical device, the glass cell and a photodetector are integrally accommodated in a non-magnetic case.

In another embodiment, the photodetector is provided, not in the magnetic sensor but outside the magnetic shield, and the excitation light passed through the glass cell is introduced via multi-mode optical fiber to the photodetector.

Further, in another embodiment, a constant-temperature water circulation device provided outside the magnetic shield and the magnetic sensor are connected with a thermal insulation tube. Further, a heat preserving mechanism is provided to flow warm water generated with the constant-temperature water circulation device through only a side surface of the glass cell, through which the excitation light does not pass, in the magnetic sensor.

According to an aspect of the present invention, it is possible to realize a stable operation of an optical pumping magnetic sensor with a structure having a glass-cell heat preserving mechanism to prevent collapse of polarization or fluctuation of light intensity of a laser beam incident on the glass cell so as not to cause influence on the laser beam.

BRIEF DESCRIPTION OF THE DRAWINGS

The above and other object, features and advantages of the present invention will become more apparent from the following detailed description when taken in conjunction with the accompanying drawings wherein.

DETAILED DESCRIPTION OF THE PREFERRED EMBODIMENTS

Preferred embodiments of the present invention will now be described in detail in accordance with the accompanying drawings.

First Embodiment

Figure 1:
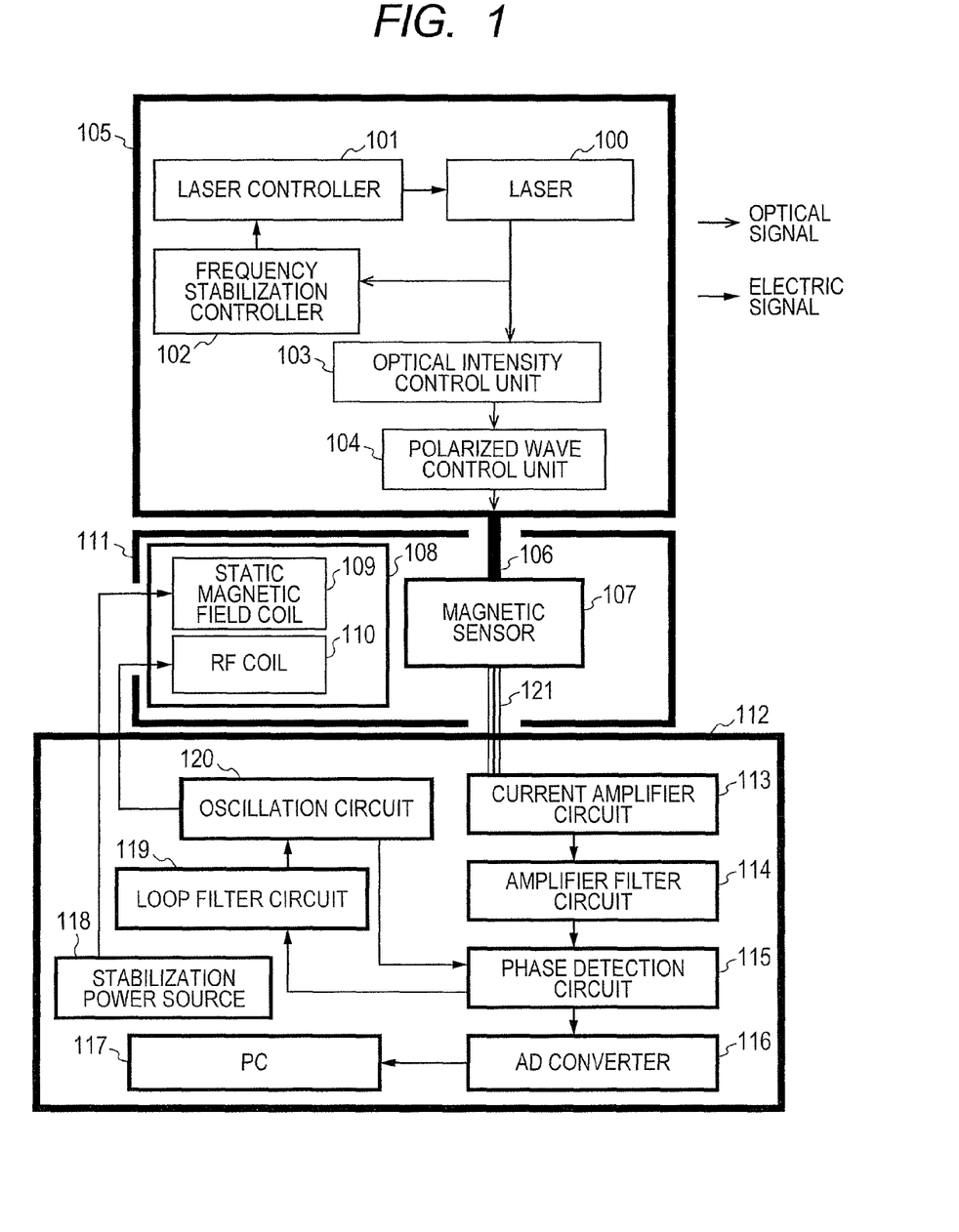
FIG. 1 is a block diagram showing the entire configuration of a magnetometer using an optical pumping magnetic sensor according to a first embodiment of the present invention.

FIG. 1 schematically shows the configuration of a magnetometer according to a first embodiment of the present invention. The magnetometer has a light source 105, a coil 108, a magnetic sensor 107, and a signal control processor 112.

As the light source, a lamp may be used, however, it is preferable to use a stable and high-performance laser. Accordingly, a laser 100 is used in the light source 105 according to the present embodiment.

It is necessary for the laser to operate the optical pumping magnetic sensor to satisfy the following conditions. It is necessary to perform oscillation around a frequency of excitation transition (line D1 and line D2) of alkali metal entered the glass cell in the magnetic sensor. It is necessary to perform single mode laser oscillation at a stable oscillation frequency. The laser beam width must be equal to or less than a natural width of alkali metal atoms. It is necessary to output a laser beam to sufficiently excite the alkali metal atoms. The laser 100 having a small size and a low price is a semiconductor laser. Further, it is particularly preferable to use an external resonator type semiconductor laser where a diffraction grating is provided outside the laser device.

The details in the case of the external resonator type semiconductor laser will be described. In the external resonator type semiconductor laser, the laser oscillation frequency amplitude can be narrowed to 1 MHz or lower with an auxiliary resonator structure provided in the laser device. Further, the laser oscillation frequency can be selected by angular change of the diffraction grating. Generally, the laser beam outputted from a semiconductor laser device is spread, accordingly, the light is converted through a collimator lens into collimated light, and is inputted into the diffraction grating. Then zero-order diffracted light as reflected light from the diffraction grating is outputted to the outside the laser device, and first-order diffracted light is returned to the laser device. Thus the external resonator is constructed. An oscillation wavelength λ depending on the external resonator is determined with $$\lambda = 2d \sin \theta \quad \text{(Expression 1)}$$

Note that d means a pitch of the diffraction grating, and $\Theta$, a diffraction angle. The angular control of the diffraction grating is performed with the diffraction grating or a piezoelectric device attached to a mirror to guide the laser beam to the diffraction grating. Further, to suppress drift of the laser oscillation frequency due to temperature change to a minimum, the temperature is monitored with a thermister arranged in the vicinity of the semiconductor laser device, then temperature stabilization is performed with a Peltier device installed under the mount of the semiconductor laser device.

The laser 100 having the above structure is provided with a frequency stabilization controller 102 and an optical intensity control unit 103, accommodated in a metal case, having a hole in a side surface for output of a laser beam. The laser beam outputted from the laser 100 is inputted through an optical isolator into a beam splitter and is split into two beams. One laser beam is used as a laser frequency stabilization control signal. The other laser beams is used as excitation light for the magnetometer. The frequency stabilization control signal from the frequency stabilization controller 102 is inputted into the laser controller 101, thus frequency-stabilized laser output is obtained.

The frequency stabilization control will be described in more detail. The oscillation frequency of the external resonator type semiconductor laser is controlled by changing the temperature of the semiconductor laser device, the input current, the voltage of the piezoelectric device or the like. Generally as these physical quantities drift, the oscillation frequency of the external resonator type semiconductor laser also drifts. Accordingly, the frequency stabilization controller 102 is required. The laser beam split with the beam splitter is used as a base for frequency-stabilizing a signal of absorption of alkali metal atoms obtained through a reference glass cell filled with only the alkali metal. As the absorption line of the alkali metal atoms in the reference glass cell has uneven spread of several hundred MHz even at a normal temperature due to thermal motion, it is not possible to observe the ultrafine structure of the alkali metal atom having a several MHz natural width. Accordingly, to obtain the absorption line, the laser beam incident on the reference glass cell is split into two beams. The laser beams split to be opposite to each other enter the glass cell. At this time, the optical intensity of one laser beam (pump light) is high, while that of the other laser beam (probe light) is lower. The alkali metal atoms are excited and saturated with the high-intensity pump light, and the frequency of the probe light is swept, such that the resonance frequency of the saturated alkali metal atoms has recession due to the reduction of probe light absorption. The line width of the recession corresponds to the natural width of the alkali metal atoms. The frequency is stabilized by locking the laser oscillation frequency to the peak or slope of the recession. When the peak of the recession is used, upon sweeping of the laser frequency, the voltage signal of the piezoelectric device is modulated. Then, a distributed type error signal, obtained by phase detection from the modulated component with a phase detection circuit, is passed through an integration circuit. Then feedback control is performed on the piezoelectric device and the input current to the semiconductor laser device. Further, when the slope of the recession is locked, the slope inclination is passed through the integration circuit as an error signal. Then feedback control is performed on the piezoelectric device and the input current to the semiconductor laser device.

The other laser beam split with the beam splitter becomes excitation light for magnetic field measurement. More particularly, the excitation light is controlled with an optical intensity control unit 103 to optimum laser power, and is outputted via a polarized wave control unit 104. As the optical intensity control unit 103, e.g., an ND filter is used. As a polarized wave control unit 104, a λ/2 wavelength plate or a polarizer is used. To suppress the influence of environment such as ambient air and vibration, a light source 105 is accommodated in a metal case. The metal case has a hole to which a fiber connector is attached for connection between the polarized wave holding optical fiber 106 and the metal case. The excitation light passed through the optical intensity control unit 103 and the polarized wave control unit 104 is outputted through the polarized wave holding optical fiber 106 to the outside the metal case.

Figure 2:
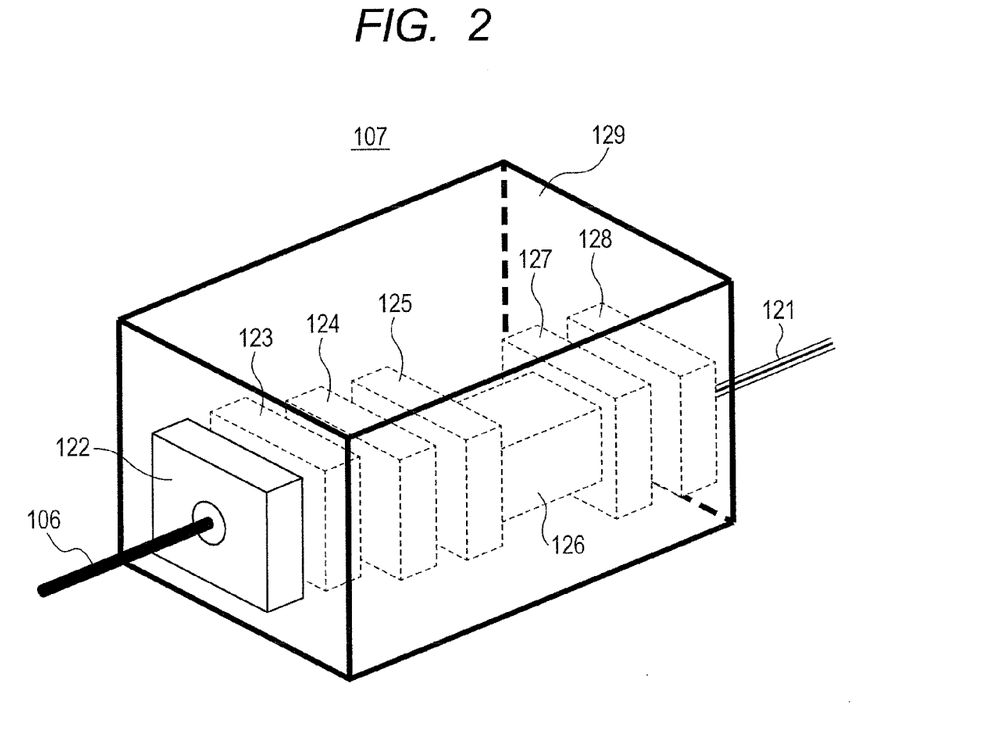
FIG. 2 is a perspective diagram showing a magnetic sensor according to the first embodiment.

The metal case of the light source 105 and the magnetic sensor 107 are connected with the above-described polarized wave holding optical fiber 106. The excitation light is introduced via the polarized wave holding optical fiber 106 to the magnetic sensor 107. The structure of the magnetic sensor 107 is shown in FIG. 2. The magnetic sensor 107 has a collimator lens 123, a polarizer 124, a λ/4 wavelength plate 125, a glass cell 126, a light collecting lens 127 and a photodetector 128, integrated with non-magnetic material such as ceramic or resin. A fiber connector 122 is attached to a non-magnetic case 129 or the magnetic sensor 107, and with this arrangement, the polarized wave holding optical fiber 106 is fixed. The excitation light emitted from the polarized wave holding optical fiber 106 is converted with the collimator lens 123 into collimated light. Then, the status of the linear polarized light is controlled with the polarizer 124, further, converted with the λ/4 wavelength plate 125 into circularly polarized light, and is inputted into the magnetic-sensor glass cell 126. As the glass cell 126, a glass cell filled with alkali metal (potassium, rubidium or cesium) and non-magnetic buffer gas (e.g., helium, neon, argon or nitrogen), or a glass cell, with its inner wall coated with saturated hydrocarbon (paraffin), filled with alkali metal, is used. In the non-magnetic case 129, the collimator lens 123, the polarizer 124, the λ/4 wavelength plate 125, the glass cell 126, the light collecting lens 127 and the photodetector 128 are all coaxially arranged, and the structure has high resistance against optical path shift due to vibration. The laser beam passed through the glass cell 126 is introduced via the light collecting lens 127 to the photodetector 128, and the light quantity is detected.

In the present embodiment, as the photodetector 128 is provided in the vicinity of the glass cell 126 and integral with the glass cell 126, detection loss is small. To prevent magnetic noise caused from the photodetector 128, a photodetector with a package formed of non-magnetic material such as ceramic or plastic is used.

Returning to FIG. 1, the structure of the magnetometer will be described again. The coil 108 has a static magnetic field coil 109 and an RF coil 110 to apply static magnetic field and RF magnetic field to the glass cell 126 inside the magnetic sensor 107. To reduce environmental magnetic noise, the coil 108, the magnetic sensor 107 and a magnetic field generation source as a subject of measurement are provided in magnetic flux shield space in the magnetic shield 111. More particularly, the magnetic shield 111 is a magnetic shield room or a magnetic shield case formed of permalloy with high magnetic permeability. For example, when the subject of magnetic field measurement is large such as a human, the magnetic shield room is used. The size of the magnetic shield 111 is determined in accordance with size of the subject of measurement. To operate the magnetic sensor 107, a static magnetic field is applied to the glass cell 126, to Zeeman split the energy transition of the alkali metal in the glass cell. By supplying a current accurately controlled with the stabilization power source 118 to the static magnetic field coil 109, the static magnetic field is applied from the static magnetic field coil 109 to the glass cell 126. Further, to change the magneto-optical properties of the glass cell 126 with the RF coil 110, the RF magnetic field, having a frequency of precession movement of electronic spin of the alkali metal atoms, is applied to the glass cell 126. At this time, the signal-to-noise ratio of the magnetic measurement signal is the maximum and optimum when the angle formed with the travelling direction of the laser beam passing through the glass cell 126 and the application direction of the static magnetic field is 45 or 135 degree. Further, the application direction of the RF magnetic field is orthogonal to the application direction of the static magnetic field or parallel with the travelling direction of the laser beam. It is preferable that the static magnetic field coil has three types of Helmholtz coils and remaining magnetic noise in the magnetic shield can be corrected.

The output from the photodetector 128 of the magnetic sensor 107 is connected to the signal control processor 112 outside the magnetic shield 111 via the electromagnetic shield line 121. The signal control processor 112 has a current amplifier circuit 113, an amplifier filter circuit 114, a phase detection circuit 115, an AC converter 116, a PC 117, the stabilization power source 118, a loop filter circuit 119 and an oscillation circuit 120. The current signal outputted from the photodetector 128 is converted with the current amplifier circuit 113 into a voltage signal, and controlled with the amplifier filter circuit 114 to have a gain and a band necessary for measurement. The output from the amplifier filter circuit 114 is phase-detected with the phase detection circuit 115 with reference to the signal from the oscillation circuit 120 as a signal source of the RF magnetic field. Then control is performed not to perform oscillation with the loop filter circuit 119 based on the phase-detected phase signal by phase delay, and feedback control is performed on the oscillation frequency by voltage control by inputting the output from the loop filter circuit 119 into the oscillation circuit 120. It is possible to detect the magnetic field from the subject of measurement entered the glass cell 126 by output change of the phase detection circuits 115 to 119 upon feedback control.

In the present embodiment, the laser frequency stabilization using a saturated absorption signal obtained with pump light and probe light is realized with a low-price and compact structure. This is a typical laser frequency stabilization method. In addition, other method such as stabilization method using stabilization of a laser beam with sideband using an electro-optical phase demodulator and resonance information upon incidence on a high finesse optical resonator (Pound-Drever-Hall method) described in Appl. Opt. 37 (1998) 3295, or frequency stabilization method using a differential signal between Zeeman-split right circularly polarized light and left circularly polarized light with respect to alkali metal vapor (Dichroic-Atomic-Vapor-Laser-Lock) as described in Appl. Opt. 37 (1998) 3295 may be employed. Further, the most simple frequency stabilization by control of laser device temperature and control of input current to the laser device is available as long as laser conditions necessary for the above-described operation of the optical pumping magnetic sensor are satisfied. Further, in the above description, the semiconductor laser is used in consideration of low-cost and compact structure, however, other laser than the semiconductor laser can be used as long as it includes an absorption wavelength of the alkali metal in the magnetic-sensor glass cell 126. Actually, it is possible to obtain high frequency stability with the external resonator type semiconductor laser. Further, a distributed feedback semiconductor laser in which a diffraction grating mechanism is included in a semiconductor has a structure having high resistance against acoustic noise and vibration nose, and is practically more usable.

The connection between the light source 105 and the magnetic sensor 107 via the polarized wave holding optical fiber 106 is made in the magnetic shield 111 formed of permalloy to reduce environmental magnetic noise which enters the magnetic sensor 107. The polarized wave holding optical fiber 106 is used in a fixed position not to change the intensity or polarized status of the excitation light. Further, it is preferable that the polarized wave holding optical fiber 106 is used in a length as short as possible. As the photodetector 128 in the magnetic sensor, a detector formed of a ceramic or plastic material is used in consideration of magnetic noise from the photodetector 128. The photodetector 128 is connected via the electromagnetic shield line 121 to the current amplifier circuit 113 outside the magnetic shield. It is preferable that the shield line is as short as possible in consideration of matching between the capacitance connected in parallel with the operational amplifier in the current amplifier and the inter-terminal capacitance of the photodetector including the shield line. Further, when the electromagnetic shield line 121 is a shielded twisted pair line, it has resistance against electromagnetic noise.

Second Embodiment

Figure 3:
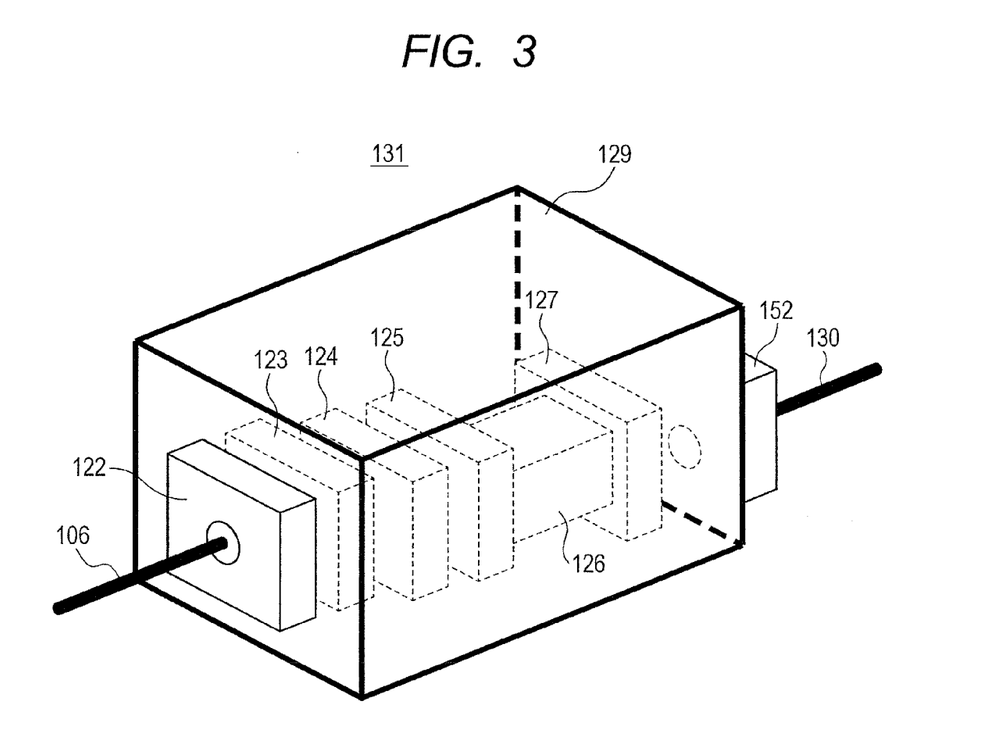
FIG. 3 is a perspective diagram showing the magnetic sensor according to a second embodiment of the present invention.

In a second embodiment of the present invention, the configuration of the magnetic sensor is different from that in the above-described first embodiment. FIG. 3 shows the structure of the magnetic sensor 131 according to the second embodiment. In comparison with the magnetic sensor 107 according to the first embodiment as shown in FIG. 2, the difference is that the photodetector 128 is omitted, and the laser beam passed through the magnetic-sensor glass cell 126 is collected with the light collecting lens 127 at an end surface of the multi-mode optical fiber 130 and outputted with the multi-mode optical fiber 130 to the outside the magnetic sensor 131. The multi-mode optical fiber 130 is attached to the non-magnetic case 129 with a non-magnetic fiber connector 152. The structure from the polarized wave holding optical fiber 106 to introduce the excitation light to the glass cell 126 is the same as that of the magnetic sensor 107 according to the first embodiment in FIG. 2.

Figure 4:
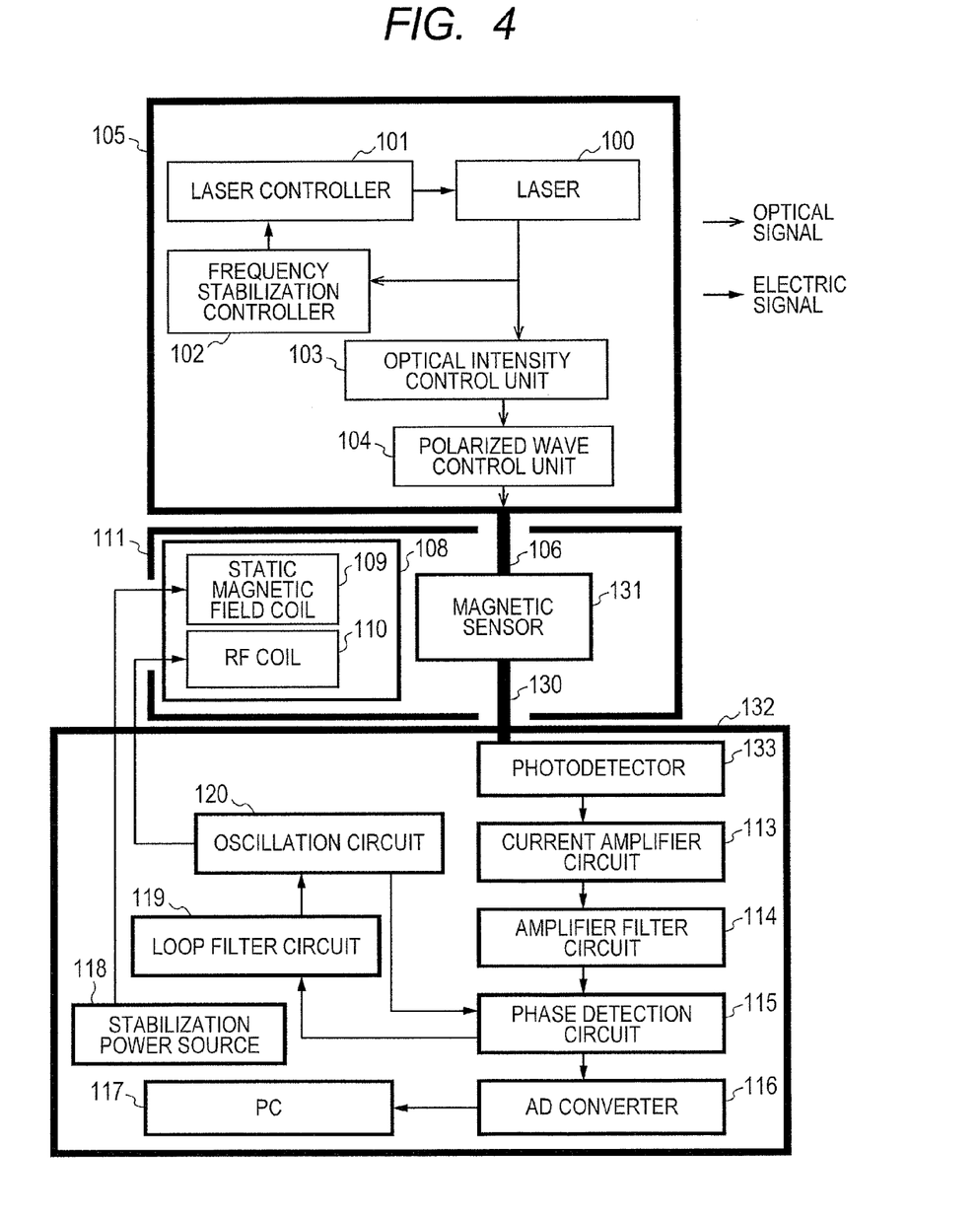
FIG. 4 is a block diagram showing the entire configuration of the magnetometer according to the second embodiment.

FIG. 4 shows the entire configuration of the magnetometer according to the second embodiment. The signal control processor 132 has a photodetector 133. The photodetector 133 is connected to the multi-mode optical fiber 130, and the light outputted from the magnetic sensor 131 is detected via the multi-mode optical fiber 130. The photodetector 133 is connected to the current amplifier circuit 113. The configuration of the signal control processor 132 from the current amplifier circuit 113 and the subsequent elements is the same as that of the signal control processor 112 according to the first embodiment (FIG. 1). Further, the operation of the light source 105, the operation of the coil 108, and the connection from the light source 105 to the magnetic sensor 131 are the same as those in the first embodiment. Accordingly, in FIG. 4, the constituent element blocks identical to those in FIG. 1 have the same reference numerals as those in FIG. 1.

As it is understood from the above description, in the second embodiment, the photodetector 133 is provided outside the magnetic shield, and the excitation light passed through the glass cell 126 in the magnetic sensor is introduced via the light collecting lens 127 to the photodetector 133 using the multi-mode optical fiber 130. The other elements than the elements to detect the laser beam passed through the glass cell 126 in the magnetic sensor 131 are the same as those in the first embodiment. Accordingly, in FIG. 3, the element blocks identical to those in FIG. 2 have the same reference numerals as those in FIG. 2. In the magnetometer according to the second embodiment, as the detection of the excitation light is made using optical fiber, no magnetic noise is caused from the photodetector in comparison with the first embodiment. However, as the coupling efficiency of the optical fiber is not 100%, there is loss in the detection signal. Then, to increase the coupling efficiency, the multi-mode optical fiber 130 having a core diameter as large as possible is employed. Generally, the multi-mode optical fiber 130 does not have polarized wave surface preservation function. However, the collapse of polarization which is a problem in the incident light to the glass cell 126 does not cause any problem in the detection of light quantity of the detected light. Accordingly, there is no problem in use of the multi-mode optical fiber 130.

The multi-mode optical fiber 130 is connected to the photodetector 133 outside the magnetic shield, and light passed through the multi-mode optical fiber 130 is detected. The photodetector 133 is connected with the current amplifier circuit 113. It is preferable that the photodetector 133 and the current amplifier circuit 113 are not connected via the shield line, but the photodetector 133 and the current amplifier circuit 113 are integrally used. This structure has resistance against electromagnetic noise.

Third Embodiment

Figure 5:
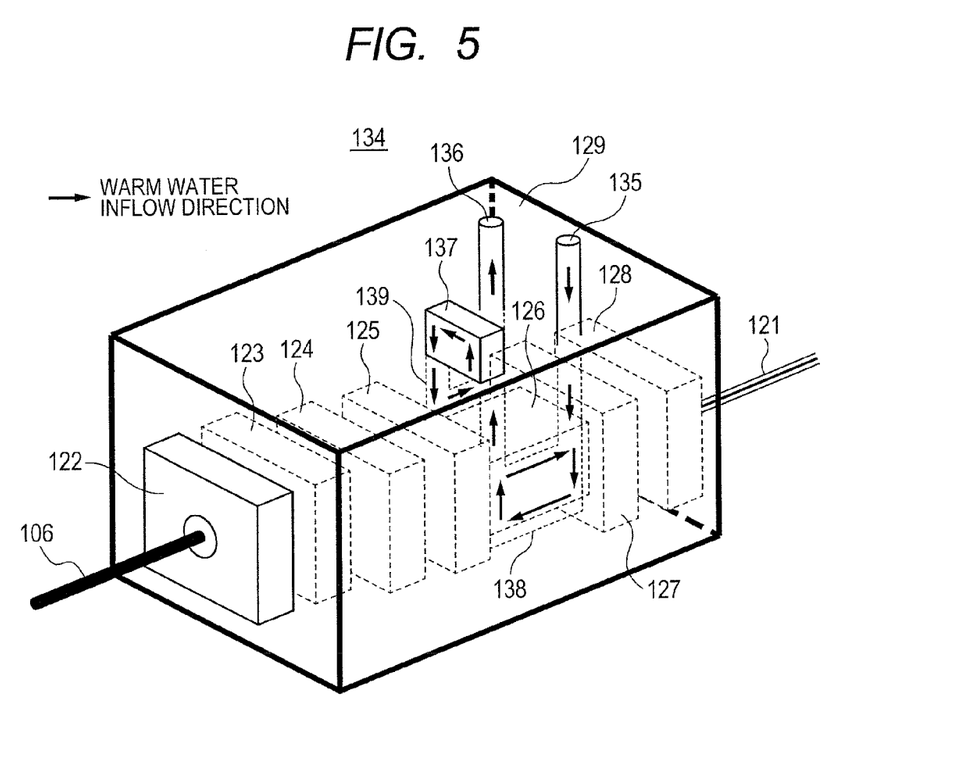
FIG. 5 is a perspective diagram showing the magnetic sensor of the magnetometer according to a third embodiment of the present invention.

In a third embodiment of the present invention, the magnetic sensor 107 according to the first embodiment has a heat preserving mechanism heat preserving mechanism. FIG. 5 shows the structure of a magnetic sensor 134 in the magnetometer according to the third embodiment. In comparison with the magnetic sensor 107 according to the first embodiment shown in FIG. 2, the difference is that chambers 138 and 139 which warm water flows in are provided in an outer surface of a glass wall of the magnetic-sensor glass cell 126. The magnetic-sensor non-magnetic case 129 is provided with a warm water inflow port 135 connected to the chamber 138. The chamber 138 is connected to the chamber 139 via a connection unit 137, and further, the chamber 139 is connected to a warm water outflow port 136 so as to pass warm water through. The structure from the polarized wave holding optical fiber 106 to introduce the excitation light to the magnetic-sensor photodetector 128 to detect the laser beam passed through the magnetic-sensor glass cell 126 is the same as that of the magnetic sensor 107 according to the first embodiment (FIG. 1). Accordingly, in FIG. 5, the element blocks identical to those in FIG. 2 have the same reference numerals as those in FIG. 2.

Figure 6:
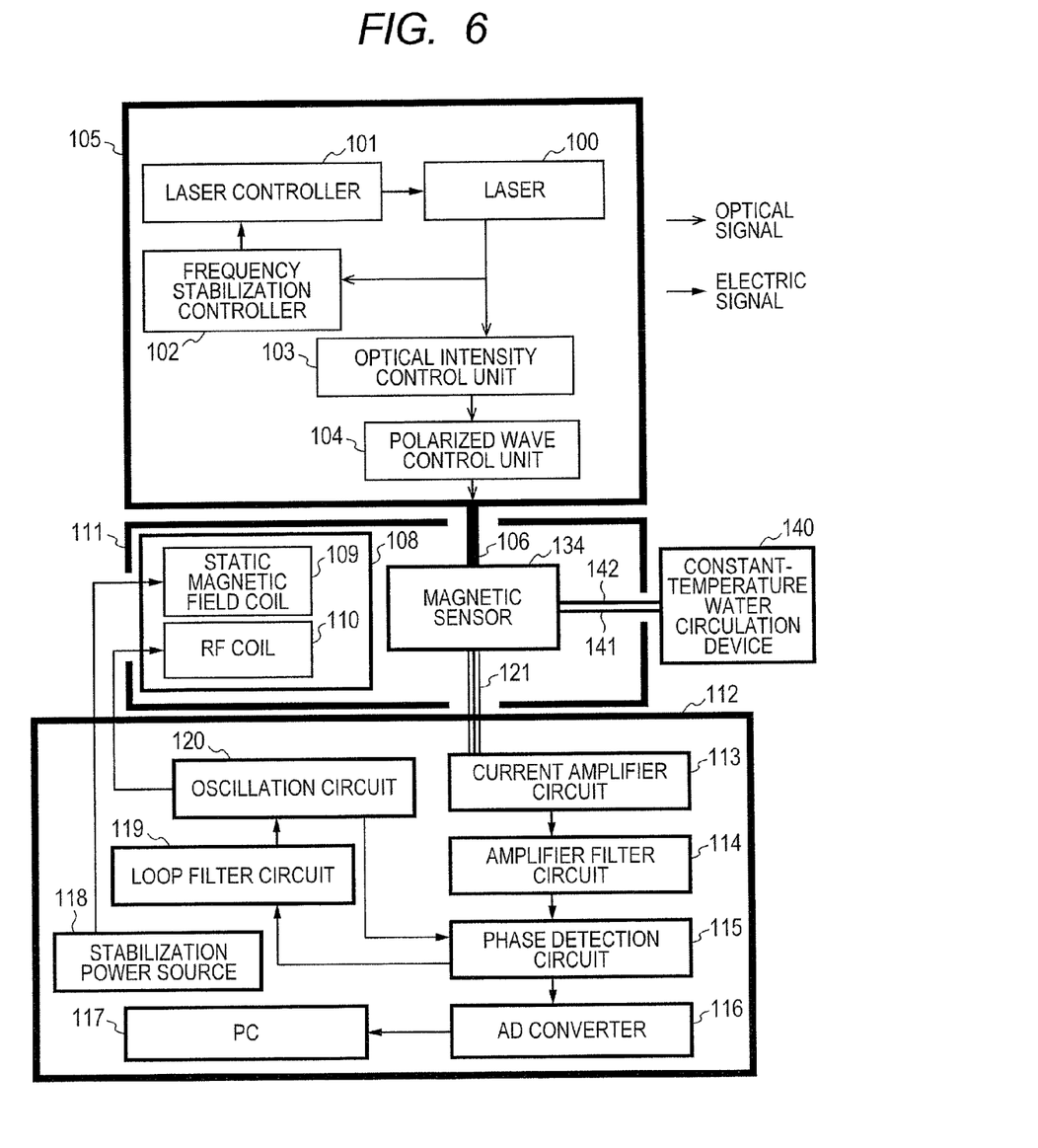
FIG. 6 is a block diagram showing the entire configuration of the magnetometer according to the third embodiment.

FIG. 6 shows the entire configuration of the magnetometer according to the third embodiment. The configuration of the signal control processor 112, the connection from the light source 105 to the magnetic sensor 134, and the operation of the coil 108 are the same as those in the first embodiment (FIG. 1). Accordingly, in FIG. 6, the element blocks identical to those in FIG. 1 have the same reference numerals as those in FIG. 1.

The warm water inflow port 135 provided in the magnetic sensor 134 is connected to the constant-temperature water circulation device 140 provided outside the magnetic shield 111 via the thermal insulation tube 141. The warm water outflow port 136 is connected to the constant-temperature water circulation device 140 provided outside the magnetic shield 111 via the thermal insulation tube 142. The constant-temperature water circulation device 140 heats water to warm water with a heater incorporated in its inner water tank. The temperature of the warm water is accurately controlled by PID controlling the heater temperature to a desired temperature. The warm water from the constant-temperature water circulation device 140 flows through the thermal insulation tube 141 and the warm water inflow port 135, then through the chamber 138, further, through the connection unit 137, flows through the chamber 139, and returns from the warm water outflow port 136 to the constant-temperature water circulation device 140. The chambers 138 and 139 as temperature reserving mechanisms to keep appropriate temperature of the magnetic-sensor glass cell 126 in the sensor 134 are provided in a side surface of the glass cell 126 except a cell window (laser non-permeable part) such that the excitation light is not disturbed with water flow.

Fourth Embodiment

Figure 7:
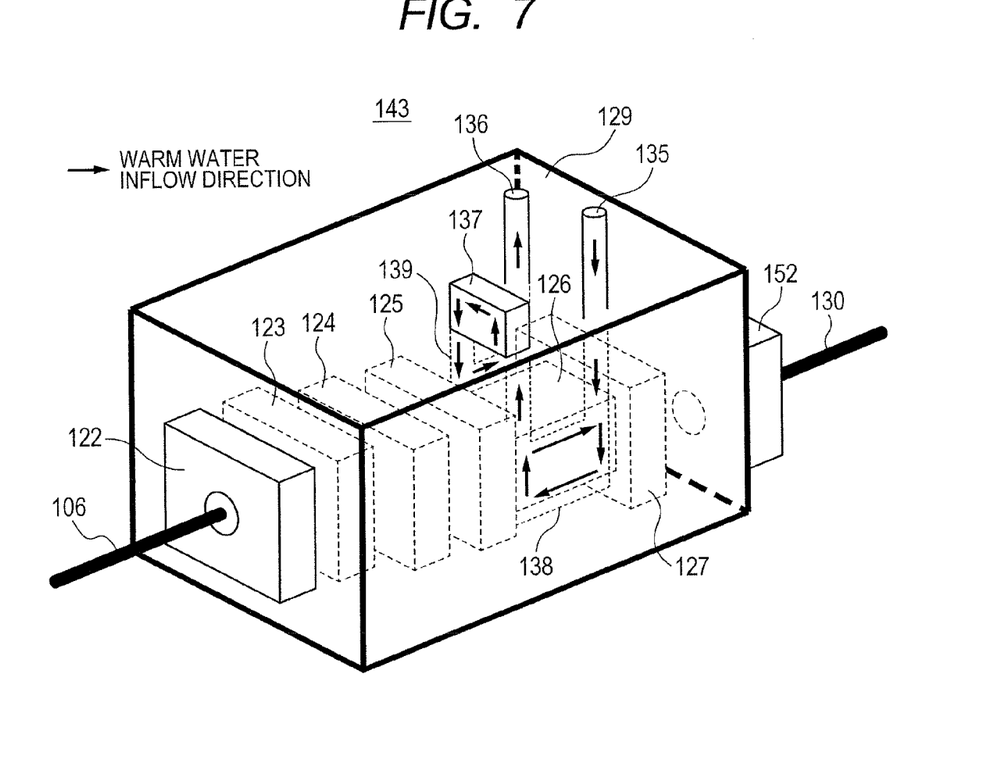
FIG. 7 is a perspective diagram showing the magnetic sensor of the magnetometer according to a fourth embodiment of the present invention.

In a fourth embodiment of the present invention, the magnetic sensor 131 according to the second embodiment has a heat preserving mechanism. FIG. 7 shows the structure of a magnetic sensor 143 according to the fourth embodiment. In comparison with the magnetic sensor 131 according to the second embodiment shown in FIG. 3, the difference is that the magnetic-sensor non-magnetic case 129 is provided with the warm water inflow port 135, and a warm water inflow port is provided in a side surface of the glass cell 126 in the magnetic-sensor non-magnetic case 129. The structure from the polarized wave holding optical fiber 106 to introduce the excitation light to the multi-mode optical fiber 130 to output the laser beam passed through the magnetic-sensor glass cell 126 is the same as that of the magnetic sensor 131 according to the second embodiment (FIG. 4). Accordingly, in FIG. 7, the element blocks identical to those in FIG. 2 have the same reference numerals as those in FIG. 2.

Figure 8:
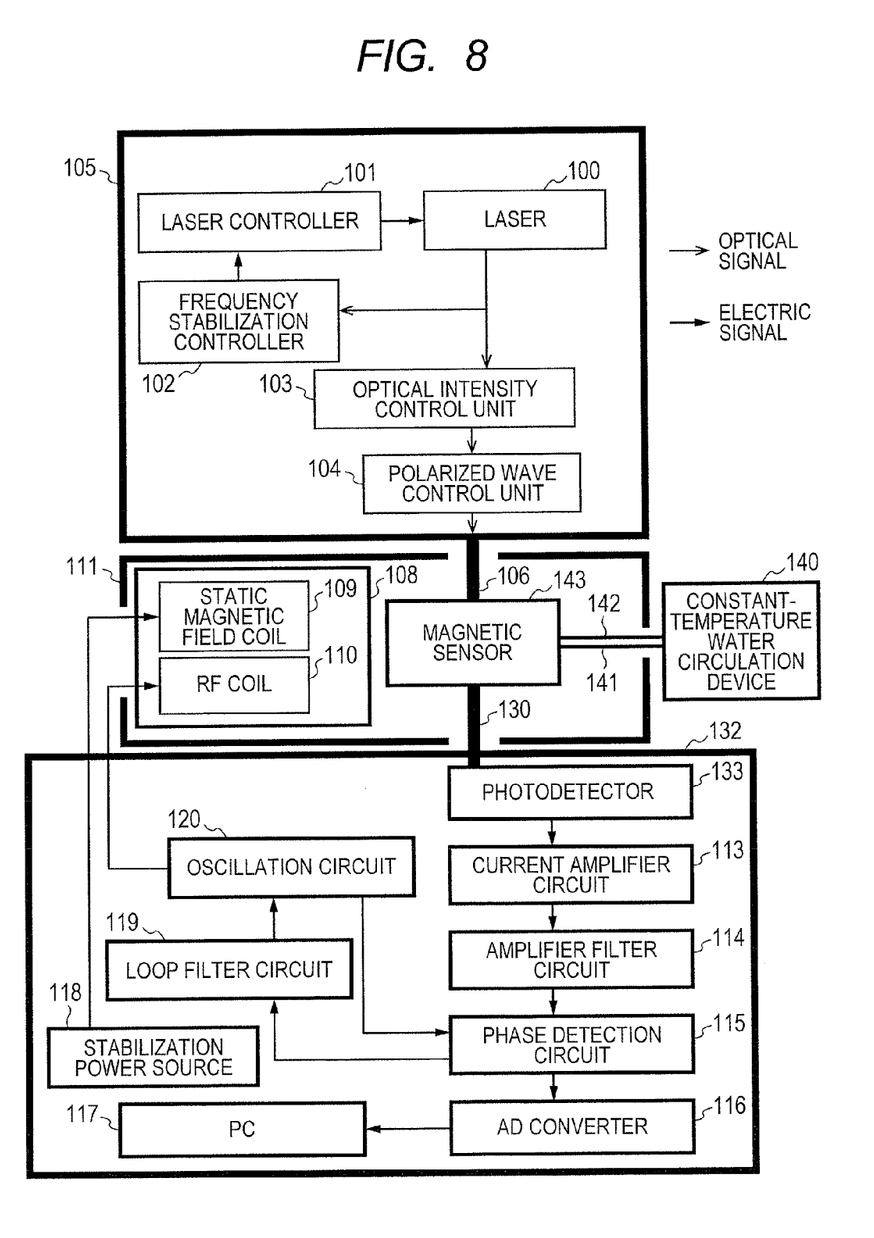
FIG. 8 is a block diagram showing the entire configuration of the magnetometer according to the fourth embodiment.

FIG. 8 shows the entire configuration of the magnetometer according to the fourth embodiment. The configuration of the signal control processor 132, the connection from the light source 105 to the magnetic sensor 143, and the operation of the coil 108 are the same as those in the second embodiment (FIG. 4). Accordingly, in FIG. 8, the element blocks identical to those in FIG. 4 have the same reference numerals as those in FIG. 4. Further, for temperature preservation of the magnetic-sensor glass cell 126, the warm water inflow port 135 and the warm water outflow port 136 provided in the magnetic sensor 143 are connected via the thermal insulation tube 141 and the thermal insulation tube 142 to the constant-temperature water circulation device 140 provided outside the magnetic shield 111 as in the case of the third embodiment. The circulation of warm water to the magnetic sensor 143 is the same as that in the above-described third embodiment. Accordingly, in FIGS. 7 and 8, the element blocks identical to those in FIGS. 3 and 4 have the same reference numerals as those in FIGS. 3 and 4.

According to the present invention, it is possible to obtain a high-accuracy and simply-controllable magnetometer without collapse of polarization or fluctuation of light intensity of excitation light to a glass cell of an optical pumping magnetic sensor. Further, contribution by the present invention can be expected in the field of fine magnetic field measurement such as biomagnetic field.

What is claimed is:
1. A magnetometer comprising:
a magnetic sensor, having a glass cell filled with alkali metal gas, that detects a magnetic field using magneto-optical properties of spin-polarized alkali metal;
a light source that generates frequency-stabilized excitation light introduced to the magnetic sensor;
a coil, provided in magnetic shield space including the magnetic sensor, that applies a static magnetic field and an RF magnetic field to the magnetic sensor; and
a signal processing device that lock-in detects a detection signal of light transmitted through the glass cell of the magnetic sensor, controls intensity of the static magnetic field and a frequency of the RF magnetic field generated from the coil based on a lock-in detection output, and obtains a measurement signal reflecting magnetic field intensity of a measurement subject set in the magnetic shield,
wherein the magnetic sensor has a structure where a collimator lens that the frequency-stabilized excitation light from the light source is introduced via a polarized wave holding optical fiber, a polarization optical device that transmits the excitation light passed through the collimator lens to the glass cell, and the glass cell, are integrally accommodated in a non-magnetic case,
wherein the magnetic sensor further has a light collecting lens, accommodated in the non-magnetic case, that collects the light transmitted through the glass cell on an end surface of a multi-mode optical fiber, and
wherein the magnetic sensor transmits the light via the multi-mode optical fiber to a photodetector provided outside the magnetic shield.
2. The magnetometer according to claim 1, further comprising a heat preserving mechanism that circulates warm water to a side surface of the glass cell of the magnetic sensor which the excitation light is not passed through.
3. A magnetometer comprising:
a magnetic sensor, having a glass cell filled with alkali metal gas, that detects a magnetic field using magneto-optical properties of spin-polarized alkali metal;
a light source that generates frequency-stabilized excitation light introduced to the magnetic sensor;
a coil, provided in magnetic shield space including the magnetic sensor, that applies a static magnetic field and an RF magnetic field to the magnetic sensor;
a signal processing device that lock-in detects a detection signal of light transmitted through the glass cell of the magnetic sensor, controls intensity of the static magnetic field and a frequency of the RF magnetic field generated from the coil based on a lock-in detection output, and obtains a measurement signal reflecting magnetic field intensity of a measurement subject set in the magnetic shield; and
a heat preserving mechanism that circulates warm water to a side surface of the glass cell of the magnetic sensor which the excitation light is not passed through,
wherein the magnetic sensor has a structure where a collimator lens that the frequency-stabilized excitation light from the light source is introduced via a polarized wave holding optical fiber, a polarization optical device that transmits the excitation light passed through the collimator lens to the glass cell, and the glass cell, are integrally accommodated in a non-magnetic case.
4. A magnetometer comprising:
a magnetic sensor, having a glass cell filled with alkali metal gas, that detects a magnetic field using magneto-optical properties of spin-polarized alkali metal;
a light source that generates frequency-stabilized excitation light introduced to the magnetic sensor;

a coil, provided in magnetic shield space including the magnetic sensor, that applies a static magnetic field and an RF magnetic field to the magnetic sensor;

a signal processing device that lock-in detects a detection signal of light transmitted through the glass cell of the magnetic sensor, controls intensity of the static magnetic field and a frequency of the RF magnetic field generated from the coil based on a lock-in detection output, and obtains a measurement signal reflecting magnetic field intensity of a measurement subject set in the magnetic shield; and a heat preserving mechanism that circulates warm water to a side surface of the glass cell of the magnetic sensor which the excitation light is not passed through, wherein the magnetic sensor has a structure where a collimator lens that the frequency-stabilized excitation light from the light source is introduced via a polarized wave holding optical fiber, a polarization optical device that transmits the excitation light passed through the collimator lens to the glass cell, and the glass cell, are integrally accommodated in a non-magnetic case, wherein the magnetic sensor further has a photodetector device that detects the quantity of the light transmitted through the glass cell and outputs an electric signal, and wherein the photodetector device is accommodated in the non-magnetic case.

* * * * *